United States Patent
Zhang

(10) Patent No.: US 7,692,249 B2
(45) Date of Patent: Apr. 6, 2010

(54) END FUNCTIONALIZATION OF CARBON NANOTUBES

(75) Inventor: Yuegang Zhang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 1262 days.

(21) Appl. No.: 10/761,575

(22) Filed: Jan. 21, 2004

(65) Prior Publication Data

US 2005/0184294 A1   Aug. 25, 2005

(51) Int. Cl.
*H01L 29/76* (2006.01)
*H01L 29/94* (2006.01)

(52) U.S. Cl. ............ 257/369; 257/E51.04; 977/742; 977/932

(58) Field of Classification Search ............ 257/347, 257/369, 401, 368, E51.04; 977/742–745, 977/932
See application file for complete search history.

(56) References Cited

U.S. PATENT DOCUMENTS

| | | | | |
|---|---|---|---|---|
| 2003/0098488 | A1* | 5/2003 | O'Keeffe et al. | 257/401 |
| 2003/0148086 | A1* | 8/2003 | Pfefferle et al. | 428/293.7 |
| 2003/0148562 | A1* | 8/2003 | Luyken et al. | 438/197 |
| 2004/0238887 | A1* | 12/2004 | Nihey | 257/347 |

FOREIGN PATENT DOCUMENTS

JP   WO-03005451   *   1/2003

* cited by examiner

*Primary Examiner*—Thanhha Pham
(74) *Attorney, Agent, or Firm*—Trop, Pruner & Hu, P.C.

(57) ABSTRACT

Carbon nanotubes may be selectively opened and their exposed ends functionalized. Opposite ends of carbon nanotubes may be functionalized in different fashions to facilitate self-assembly and other applications.

12 Claims, 5 Drawing Sheets

US 7,692,249 B2

END FUNCTIONALIZATION OF CARBON NANOTUBES

BACKGROUND

This invention relates generally to the formation and utilization of carbon nanotube structures.

Carbon nanotubes are graphene cylinders whose ends are closed by caps including pentagonal rings. The nanotube is a hexagonal network of carbon atoms forming a seamless cylinder. These cylinders can be as little as a nanometer in diameter with lengths of tens of microns in some cases. Depending on how they are made, the tubes can be multiple walled or single walled.

The carbon nanotubes may become the building blocks for mechanical, electronic, and biological structures. However, such applications require combining carbon nanotubes with one or more other elements. One way to combine these carbon nanotubes is to functionalize the nanotubes and then combine them with other chemicals or molecules.

Thus, there is a need for better ways of functionalizing carbon nanotubes.

DETAILED DESCRIPTION

Figure 1:
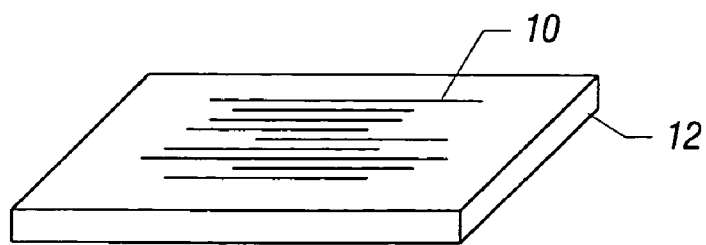
FIG. 1 is a perspective view of one embodiment of the present invention at an early stage of manufacture.

Referring to FIG. 1, carbon nanotubes 10 may be aligned on a substrate 12. The alignment may be accomplished using electric fields or molecular combining as two examples.

Figure 2:
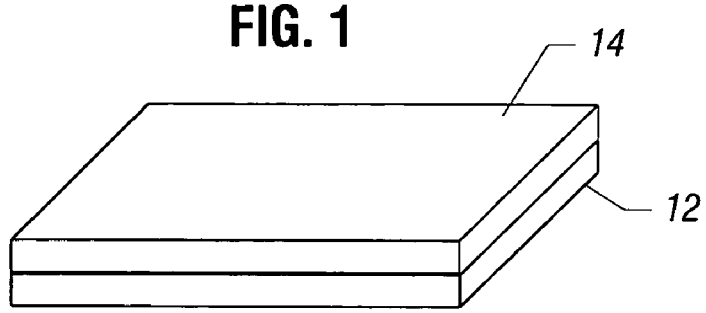
FIG. 2 is a perspective view of the embodiment shown in FIG. 1 after further processing in accordance with one embodiment of the present invention.
Figure 3:
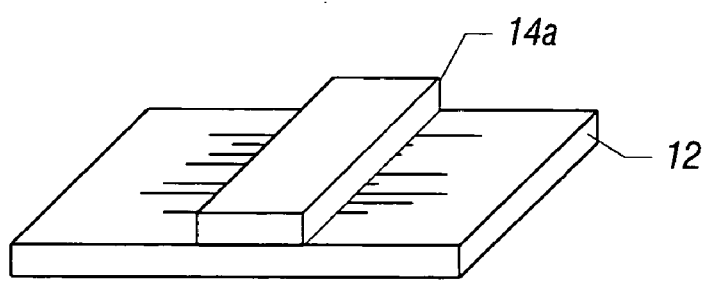
FIG. 3 is a perspective view of the embodiment shown in FIG. 2 after further processing in accordance with one embodiment of the present invention.
Figure 4:
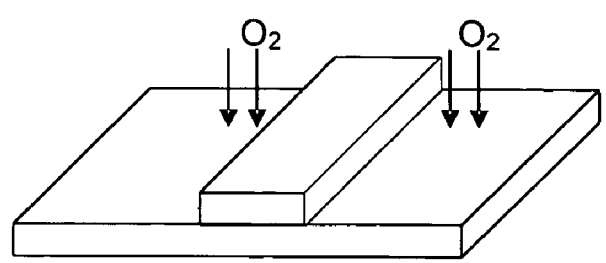
FIG. 4 is a perspective view of the embodiment shown in FIG. 3 after further processing in accordance with one embodiment of the present invention.
Figure 5:
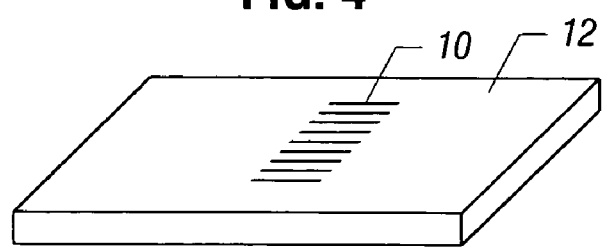
FIG. 5 is a perspective view of the embodiment shown in FIG. 4 after further processing in accordance with one embodiment of the present invention.

The substrate 12 and carbon nanotubes 10 are then covered with a photoresist layer 14 as shown in FIG. 2. The photoresist layer 14 is patterned by lithography as shown in FIG. 3 to form a mask 14a over the carbon nanotubes 10. Plasma etching, indicated as $O_2$ etching in FIG. 4, may be applied to cut nanotubes 10 into uniform length as shown in FIG. 5. The lithography may include photolithography, e-beam lithography, or other lithography. While an oxygen plasma etching process is illustrated, other techniques are possible as well.

Figure 6:
FIG. 6 is a vertical, cross-sectional view for an embodiment generally similar to FIG. 1 or FIG. 5 in accordance with one embodiment of the present invention.

As shown in FIG. 6, a carbon nanotube 10 may be aligned on a substrate 12. A number of other carbon nanotubes 10 aligned generally parallel to the illustrated nanotube 10 may be arranged extending into the page in FIG. 6.

Figure 7:
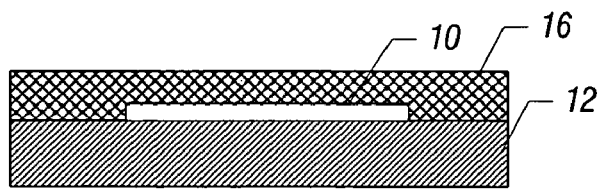
FIG. 7 is a cross-sectional view of the embodiment shown in FIG. 6 after further processing in accordance with one embodiment of the present invention.
Figure 8:
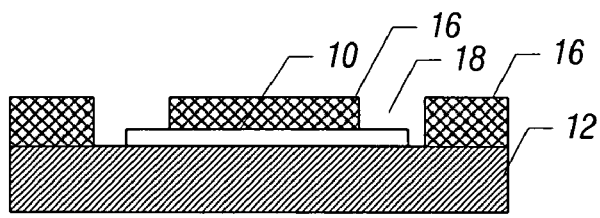
FIG. 8 is a cross-sectional view corresponding to FIG. 7 after further processing in accordance with one embodiment of the present invention.
Figure 9:
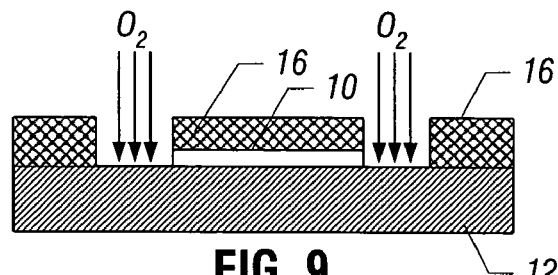
FIG. 9 is a cross-sectional view corresponding to FIG. 8 after further processing in accordance with one embodiment of the present invention.

Thereafter, the nanotubes 10 and the substrate 12 may be coated with photoresist 16 as shown in FIG. 7. Lithography may be utilized to expose the end portions of the carbon nanotubes as shown in FIG. 8. Oxygen plasma etching (FIG. 9) may then burn out the exposed end portions of the carbon nanotubes 10. The carbon nanotubes 10 are then cut to the length defined by the lithography.

Figure 10:
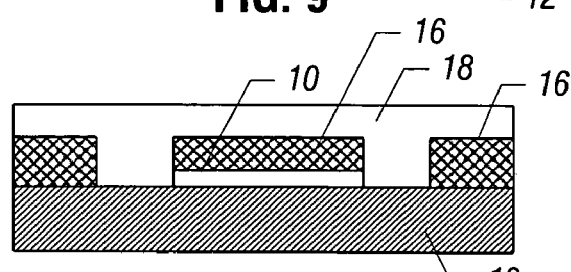
FIG. 10 is a cross-sectional view of the embodiment shown in FIG. 9 after further processing in accordance with one embodiment of the present invention.

The cut nanotubes 10 have open ends. A solution of chemical agents (layer 18) is then applied to the ends of nanotubes. The sidewalls of the nanotubes are still protected by photoresist 16. As a result, chemicals in the layer 18 (FIG. 10) can only access the open ends of the carbon nanotubes 10. One or more functional groups from the layer 18 may be attached to the open ends of the carbon nanotubes 10 from the chemical laden layer 18. Without limiting the scope of the present invention, the layer 18 may include carboxylic or amine groups. The layer 18 containing different chemicals can be applied more than once to attach multiple functional groups to the ends of nanotubes.

Figure 11:
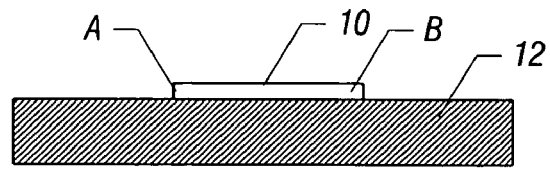
FIG. 11 is a cross-sectional view corresponding to FIG. 10 after further processing in accordance with one embodiment of the present invention.
Figure 12:
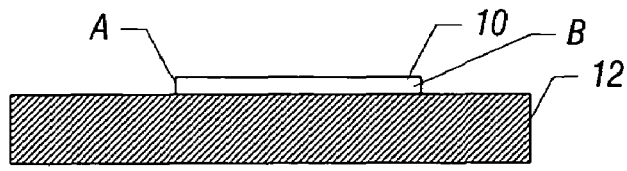
FIG. 12 is a cross-sectional view further corresponding to FIG. 6 in accordance with another embodiment of the present invention.

As shown in FIG. 11, the photoresist 16 and the chemical laden layer 18 may be removed to obtain the functionalized carbon nanotube 10. The ends A and B may both be functionalized in one embodiment.

Figure 13:
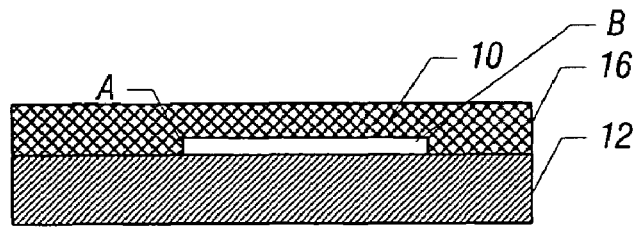
FIG. 13 is a cross-sectional view corresponding to FIG. 12 after further processing in accordance with one embodiment of the present invention.
Figure 14:
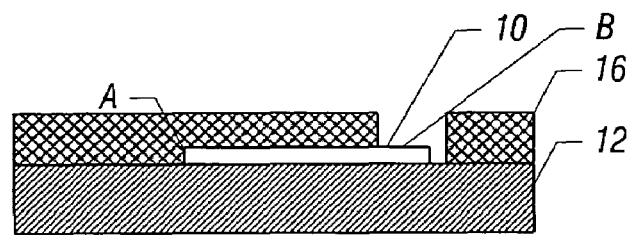
FIG. 14 is a cross-sectional view corresponding to FIG. 13 after further processing in accordance with one embodiment of the present invention.
Figure 15:
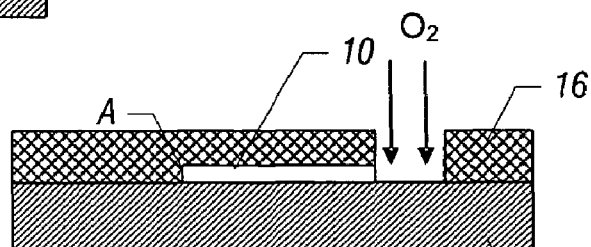
FIG. 15 is a cross-sectional view corresponding to FIG. 14 after further processing in accordance with one embodiment of the present invention.
Figure 16:
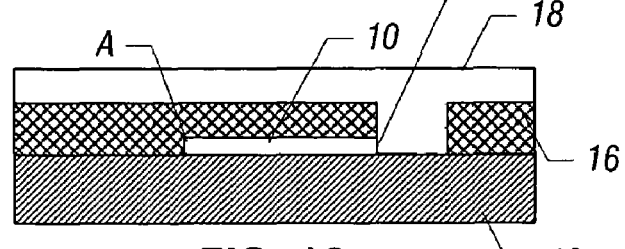
FIG. 16 is a cross-sectional view corresponding to FIG. 15 after further processing in accordance with one embodiment of the present invention.
Figure 17:
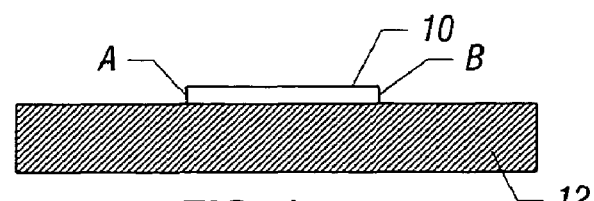
FIG. 17 is a cross-sectional view corresponding to FIG. 16 after further processing in accordance with one embodiment of the present invention.
Figure 18:
FIG. 18 is a cross-sectional view corresponding to FIG. 6 in accordance with another embodiment of the present invention.

Referring to FIGS. 12 through 17, a single end functionalization technique is illustrated. The end to be functionalized is illustrated as B in FIG. 12. The carbon nanotube 10 may be covered with photoresist 16 as shown in FIG. 13. Lithography is utilized to expose only end B of the carbon nanotube 10, as indicated in FIG. 14. The carbon nanotube 10 may be cut off to length using oxygen plasma etching as shown in FIG. 15. The exposed, open-ended tube 10 may then be coated with a chemical laden layer 18 to end functionalize the end B of the carbon nanotube 10, as shown in FIG. 16. In FIG. 17, the chemical laden layer 18 and the photoresist 16 may be removed. At this point, only the end B of the carbon nanotube 10 is functionalized. Applying the same process to end A may functionalize end A with a different molecule. The tube length may be defined by the lithography in the two-step end functionalization process.

Figure 19:
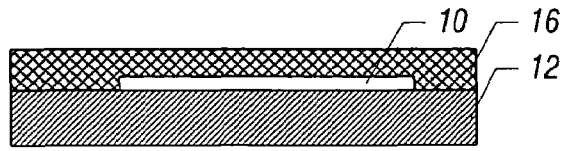
FIG. 19 is a cross-sectional view of the embodiment shown in FIG. 18 after further processing in accordance with one embodiment of the present invention.
Figure 20:
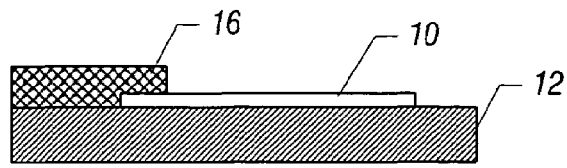
FIG. 20 is a cross-sectional view corresponding to FIG. 19 after further processing in accordance with one embodiment of the present invention.
Figure 21:
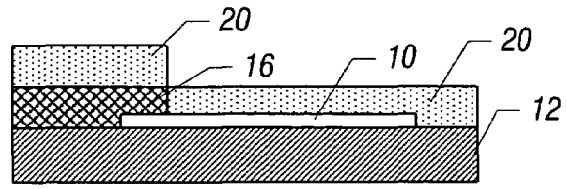
FIG. 21 is a cross-sectional view corresponding to FIG. 20 after further processing in accordance with one embodiment of the present invention.

Referring to FIGS. 18 through 25, the end A is to be functionalized with a chemical that may not be compatible with photoresist. The carbon nanotube 10 may be covered by a layer of photoresist 16 as indicated in FIG. 19. The end B of the carbon nanotube 10 may then be exposed (FIG. 20) using conventional photolithography process to remove a portion of the photoresist 16. Thereafter, a layer of silicon dioxide or another protection material 20 may be deposited over the structure as shown in FIG. 21. The deposition may be done using conventional chemical vapor deposition and lithography in one embodiment.

Figure 22:
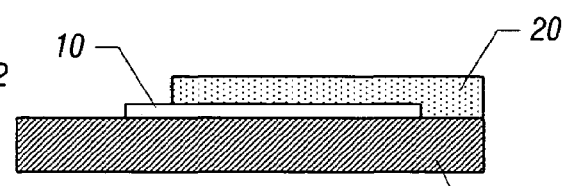
FIG. 22 is a cross-sectional view of the embodiment shown in FIG. 21 after further processing in accordance with one embodiment of the present invention.
Figure 23:
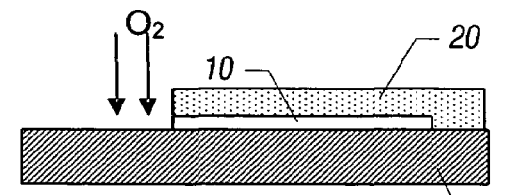
FIG. 23 is a cross-sectional view corresponding to FIG. 22 after further processing in accordance with one embodiment of the present invention.
Figure 24:
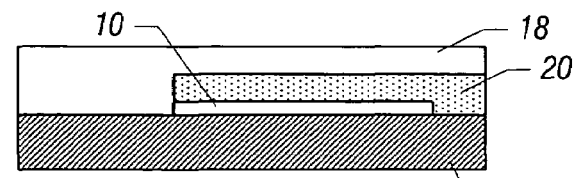
FIG. 24 is a cross-sectional view corresponding to FIG. 23 after further processing in accordance with one embodiment of the present invention.
Figure 25:
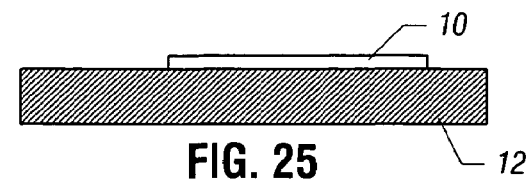
FIG. 25 is a cross-sectional view corresponding to FIG. 24 after further processing in accordance with one embodiment of the present invention.

Thereafter, the underlying photoresist 16 may be removed, resulting in the structure shown in FIG. 22. The exposed portion of the carbon nanotube 10 (not covered by the silicon dioxide 20) may then be removed using oxygen plasma etching as shown in FIG. 23. The resulting structure may then be covered with an end functionalizing chemical 18 to end functionalize the open ended carbon nanotube 10 in FIG. 24. Thereafter, the chemical 18 and the silicon dioxide 20 may be removed as shown in FIG. 25.

Figure 26:
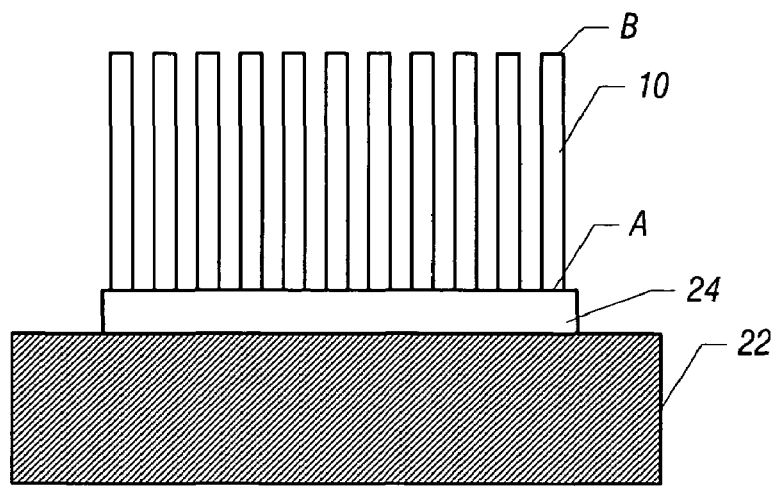
FIG. 26 is a cross-sectional view of another embodiment of the present invention.

Referring next to FIG. 26, the end functionalized carbon nanotubes 10 may be utilized for self-assembly of carbon nanotube arrays. The functionalized ends A and B are arranged so that the end B extends vertically and the end A is attached to a structure 24 to which it is attracted. The structure 24 is also functionalized with molecules that specifically bind to the functional groups on the ends A of the carbon nanotubes 10 and not the functional groups on the ends B. The end functionalized carbon nanotubes 10 already have one end A attached to the structure 24. The other end B may stay in solution. The resulting structure may form a self-aligned vertical array with uniform thickness. An example of one application is for thermal interface material (TIM) fabrication.

Figure 27:
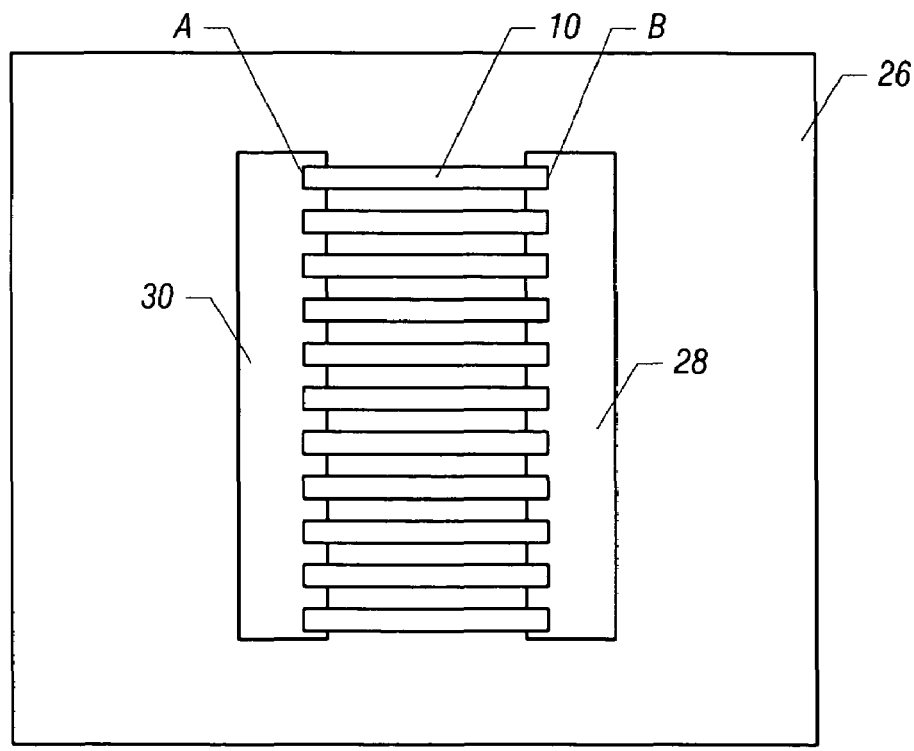
FIG. 27 is a top plan view of another embodiment of the present invention.

Referring to FIG. 27, end functionalized carbon nanotubes 10 may be utilized for self-assembly of an organized carbon nanotube array at a specific location and orientation on the substrate 26. An area 30 of the substrate 26 is functionalized with molecules that specifically bind with functional group on the end A. Another area 28 is functionalized with molecules that specifically bind with functional group B on the opposite end B of the carbon nanotubes 10. If the distance between the attachment points is equal to the length of the end functionalized carbon nanotubes 10, the first end A of the functionalized carbon nanotubes 10 binds to the area 30 and the second end B binds to the area 28.

Figure 28:
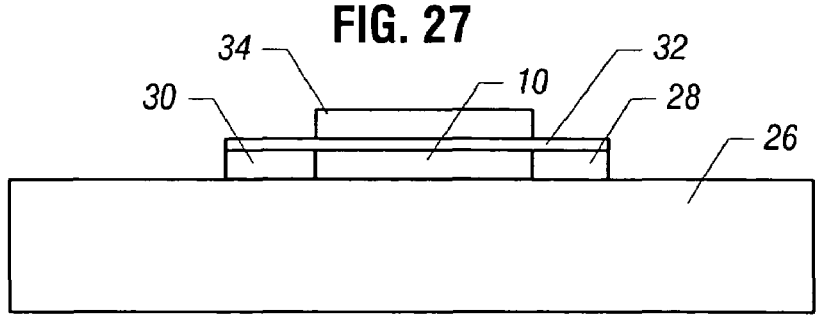
FIG. 28 is a side elevational view of the embodiment shown in FIG. 27 after further processing in accordance with one embodiment of the present invention.

Referring to FIG. 28, the structure shown in FIG. 27 may be further processed to include a gate dielectric layer 32 and a gate electrode 34. The use of an array of nanotubes 10 may increase the current drive of a transistor formed using the nanotubes 10 as an effective channel. The transistor may include a source 30 and a drain 28 that are functionalized to attach to specific carbon nanotube functionalized ends A and B.

In one embodiment, a deoxyribonucleic acid (DNA) molecule may include the information to drive the self-assembly process. A single stranded DNA molecule may be attached to the end of a carbon nanotube using the method described above. The single stranded DNA may have a sequence complementary to another single stranded DNA molecule or to a linker of a double stranded DNA at desired locations. The two DNA molecules may be bound to each other according to sequence matching between the two types of DNA molecules, and thus immobilize the end of the nanotube to the desired location.

The carbon nanotubes 10 may be functionalized with a protein streptavidin. That protein may bind to an antibody that attaches to a specific location, locating the nanotube 10 at the correct address. The nanotube assembly may be placed on a passivated, oxidized silicon wafer before metallization.

In some embodiments of the present invention it is possible to select to functionalize only one or more ends of a carbon nanotube. In some embodiments different ends may be functionalized with different molecules. Lithography and etching methods may be utilized to selectively expose one end of a carbon nanotube. The exposed end can then be chemically functionalized and may be connected with one or more other functional groups of available molecules. The second end of the carbon nanotube can be exposed by repeating the lithography and etching process. The second end of the carbon nanotube may then be functionalized with a second functional group or be connected with one or more available molecules.

In addition, end functionalized carbon nanotubes of uniform length may be utilized for these procedures. The different functionalizations at the two ends of the nanotubes may be useful in self-assembly and pattern formation for building components of carbon nanotubes. For example, it may be useful for biosensors.

Carbon nanotubes may be made either polar or amphiphilic by appropriate modification. One end of the resulting carbon molecule may then be immobilized and alignment may be achieved through molecular combing. One end only may be functionalized with biomolecules and the structure may then be utilized for a biosensor in one embodiment.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A transistor comprising:
   a source region;
   a drain region;
   a plurality of nanotubes extending between said source and drain regions, said nanotubes having functionalized ends with attached functional groups, wherein said nanotubes have opposed first functionalized ends coupled to said source region and second functionalized ends coupled to said drain region, said first functionalized ends attracted to said source region and not said drain region; and
   a gate electrode over said nanotubes.

2. The transistor of claim 1 wherein said nanotubes are parallel to one another.

3. The transistor of claim 1 wherein said nanotubes are spaced equidistantly from one another.

4. The transistor of claim 1 wherein said nanotubes are capless.

5. A transistor comprising:
   a source region;
   a drain region;
   a plurality of open ended nanotubes extending between said source and drain regions, wherein said nanotubes have opposed first functionalized ends coupled to said source region and second functionalized ends coupled to said drain region, said first functionalized ends attracted to said source region and not said drain region; and
   a gate electrode over said nanotubes.

6. The transistor of claim 5 wherein said nanotubes are parallel to one another.

7. The transistor of claim 5 wherein said nanotubes are spaced equidistantly from one another.

8. The transistor of claim 5 wherein said nanotubes have functionalized ends.

9. A transistor comprising:
   a source region;
   a drain region;
   a plurality of nanotubes extending between source and drain regions, each nanotubes including two opposed ends, the opposed ends of each nanotube having different functional groups attached to the opposed ends.

10. The transistor of claim 9 wherein said nanotubes are parallel.

11. The transistor of claim 9 wherein said nanotubes are spaced equidistantly from one another.

12. The transistor of claim 9 wherein said nanotubes have opposed first functionalized ends coupled to said source region and second functionalized ends coupled to said drain regions, said first functionalized ends attracting to said source region and not said drain region.

* * * * *